(12) United States Patent
Liu

(10) Patent No.: US 8,975,106 B2
(45) Date of Patent: Mar. 10, 2015

(54) CHIP PACKAGE AND METHOD FOR FORMING THE SAME

(76) Inventor: Chien-Hung Liu, New Taipei (TW)

( * ) Notice: Subject to any disclaimer, the term of this patent is extended or adjusted under 35 U.S.C. 154(b) by 690 days.

(21) Appl. No.: 13/176,667

(22) Filed: Jul. 5, 2011

(65) Prior Publication Data

US 2012/0009712 A1 Jan. 12, 2012

Related U.S. Application Data

(60) Provisional application No. 61/363,052, filed on Jul. 9, 2010.

(51) Int. Cl.
*H01L 21/302* (2006.01)
*H01L 21/28* (2006.01)
*B81C 1/00* (2006.01)

(52) U.S. Cl.
CPC ................................. *B81C 1/00333* (2013.01)
USPC ............... 438/51; 257/E21.214; 257/E21.158

(58) Field of Classification Search
None
See application file for complete search history.

(56) References Cited

U.S. PATENT DOCUMENTS

2011/0127620 A1* 6/2011 Wang et al. ................... 257/415

FOREIGN PATENT DOCUMENTS

| CN | 1180934 | 5/1998 |
|----|---------|--------|
| CN | 101588529 | 11/2009 |

* cited by examiner

*Primary Examiner* — Seahvosh Nikmanesh
(74) *Attorney, Agent, or Firm* — Liu & Liu

(57) ABSTRACT

A method for forming a chip package includes: providing a substrate having a first and a second surfaces; removing a portion of the substrate to form openings in the substrate, wherein the openings extend from the first surface towards the second surface or from the second surface towards the first surface; after forming the openings, at least a first portion of the substrate serves as a first movable bulk, and at least a second portion of the substrate serves as a second movable bulk, wherein the first movable bulk and the second movable bulk are respectively located between the openings; disposing a protecting substrate on the second surface of the substrate; forming a through-hole in the protecting substrate; and forming a conducting layer on the protecting substrate, wherein the conducting layer extends from a surface of the protecting substrate into the through-hole to electrically connect the second movable bulk.

18 Claims, 12 Drawing Sheets

CHIP PACKAGE AND METHOD FOR FORMING THE SAME

CROSS REFERENCE TO RELATED APPLICATIONS

This application claims the benefit of U.S. Provisional Application No. 61/363,052, filed on Jul. 9, 2010, the entirety of which is incorporated by reference herein.

BACKGROUND OF THE INVENTION

1. Field of the Invention

The present invention relates to a chip package, and in particular relates to a micro-electromechanical system (MEMS) chip package.

2. Description of the Related Art

Micro-electromechanical system (MEMS) chip packages may be applied to a variety of electronic products and is becoming more important. To satisfy the requirement of lighter, thinner, shorter, and smaller electronic products, a MEMS chip package with a smaller size and the manufacturing method thereof are desired.

BRIEF SUMMARY OF THE INVENTION

An embodiment of the invention provides: a substrate having a first surface and a second surface; a protecting substrate disposed on the second surface of the substrate; at least a through-hole penetrating the protecting substrate; a plurality of openings extending from the first surface towards the second surface or extending from the second surface towards the first surface; at least a first movable bulk and at least a second movable bulk located between the plurality of openings, wherein the first movable bulk and the second movable bulk connect with the substrate, respectively; and at least a conducting layer extending from a surface of the protecting bulk into the through-hole and electrically connected to the second movable bulk.

An embodiment of the invention provides a chip package which includes: providing a substrate having a first surface and a second surface; removing a portion of the substrate to form a plurality of openings in the substrate, wherein the plurality of openings extend from the first surface towards the second surface or extend from the second surface towards the first surface; after the plurality of openings are formed, at least a first portion of the substrate serves as a first movable bulk, and at least a second portion of the substrate serves as a second movable bulk, wherein the first movable bulk and the second movable bulk are respectively located between the plurality of openings; disposing a protecting substrate on the second surface of the substrate; forming at least a through-hole in the protecting substrate; and forming at least a conducting layer on the protecting substrate, wherein the conducting layer extends from a surface of the protecting substrate into the through-hole and is electrically connected to the second movable bulk.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as followed. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a light sensing device or a light emitting device. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

Figure 1A:
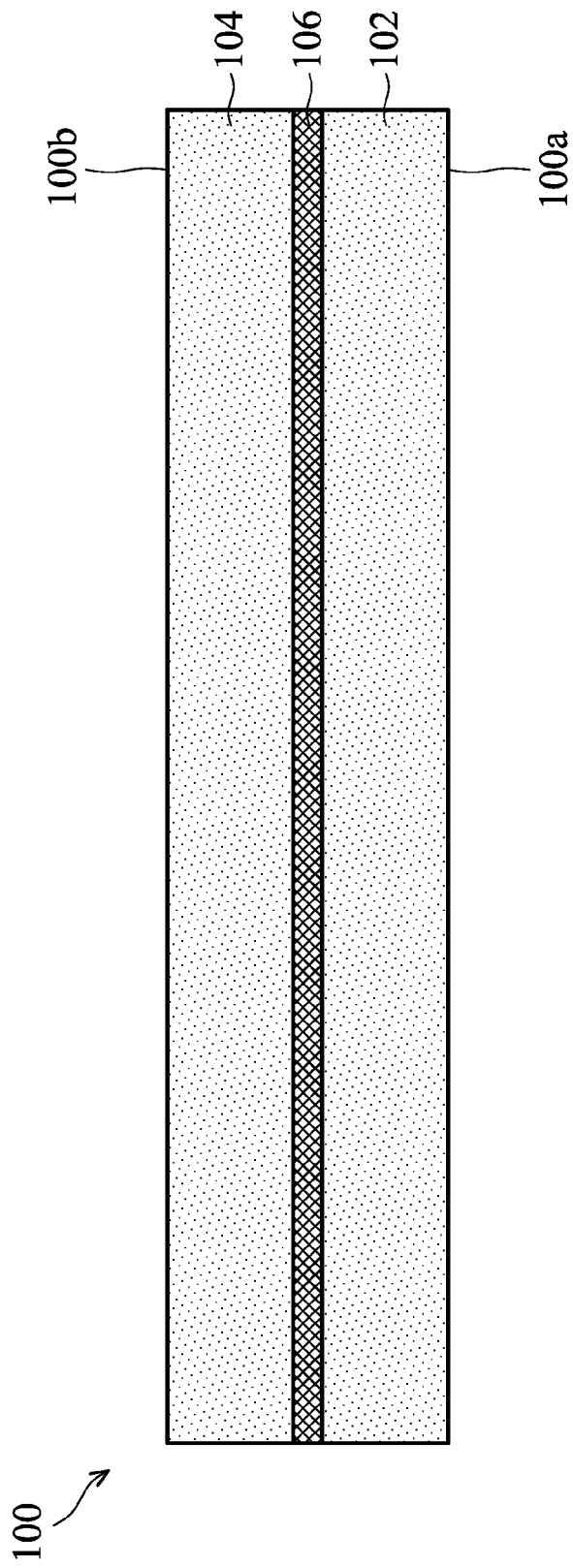
FIGS. 1A-1L are cross-sectional views showing the steps of forming a chip package in accordance with an embodiment of the present invention.

FIGS. 1A-1L are cross-sectional views showing the steps of forming a chip package in accordance with an embodiment of the present invention. As shown in FIG. 1A, a substrate 100 is provided, which includes a surface 100*a* and a surface 100*b*. The substrate 100 includes, for example, a semiconductor material or a ceramic material. In one embodiment, the substrate 100 is a semiconductor wafer (such as a silicon wafer), and thus a wafer-level package process may be performed. Fabrication cost and fabrication time may be reduced if a chip package is formed by a wafer-level package process. In one embodiment, the substrate 100 includes a semiconductor on insulator substrate such as a silicon on insulator substrate (SOI substrate). In the following description, a semiconductor on insulator substrate is used as the substrate 100. The substrate 100 includes semiconductor layers 102 and 104 and an insulating layer 106 disposed between the two semiconductor layers.

Figure 1B:
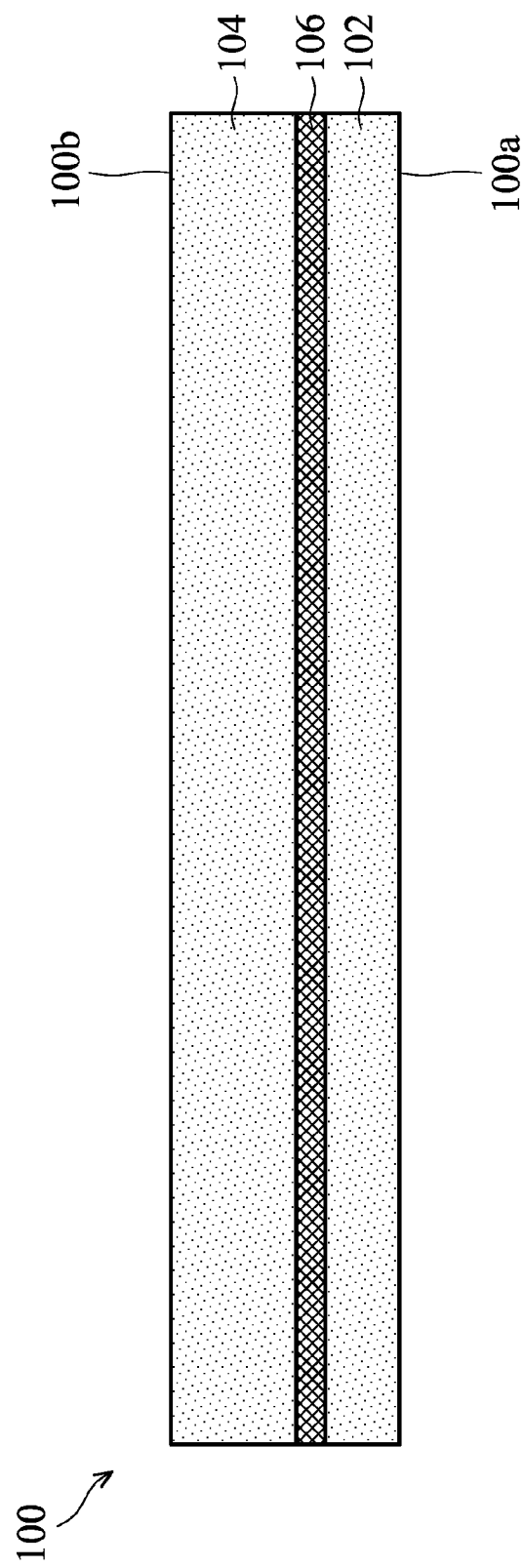

Next, as shown in FIG. 1B, the substrate 100 may be optionally thinned from the surface 100a of the substrate 100. That is, a portion of the semiconductor layer 102 is removed. For example, a chemical mechanical polishing process, mechanical grinding process, or other suitable methods may be applied to thin the substrate to a suitable thickness. For example, in one embodiment, the semiconductor layer 102 may be thinned to (but is not limited to) a thickness of about 350 μm.

Figure 1C:
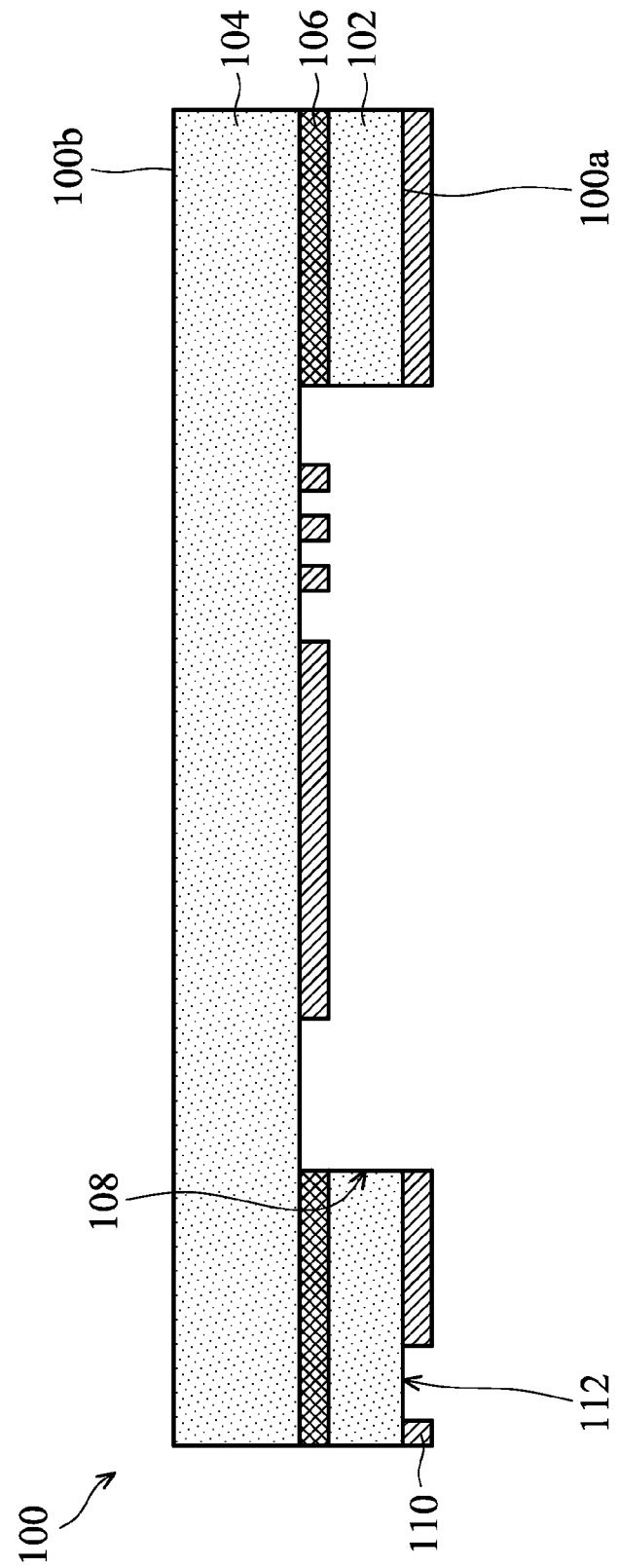

As shown in FIG. 1C, portions of the semiconductor layer 102 and the insulating layer 106 are then removed to form at least a recess 108 in the substrate 100. Typically, the chip packages according to embodiments of the invention are formed by wafer-level packaging process. Thus, it is preferable to simultaneously form a plurality of cavities in a wafer to form a plurality of chip packages. In one embodiment, a bottom of the formed recess 108 exposes the semiconductor layer 104.

Next, a metal layer 110 is formed on the surface 100a of the substrate 100 and is then patterned. The material of the metal layer 110 may include (but is not limited to) aluminum, gold, or copper. For example, a physical vapor deposition process, chemical vapor deposition process, applying process, electroplating process, electroless plating process, or other suitable methods may be applied to form the metal layer 110 on the surface 100a of the substrate 100 and the bottom of the recess 108. Then, the metal layer 110 may be patterned into a desired pattern through a photolithography process and an etching process. The patterned metal layer 110, which is located on the bottom of the recess 108, may serve as a conducting electrode or a reflective layer of a movable bulk which is formed in a following process step. The patterned metal layer 110 formed on the surface of the semiconductor layer 102 may serve as an adhesion layer, which is used, optionally, for bonding with another substrate.

In one embodiment, an alignment mark may be optionally formed in the metal layer 110 to facilitate following process steps which are performed on the surface 100b of the substrate. For example, in one embodiment, an alignment mark 112 may be formed in the metal layer 110 which serve as an adhesion layer. The alignment mark 112 may include a variety of shapes which are easily recognized, such as (but is not limited to) a cross.

Figure 1D:
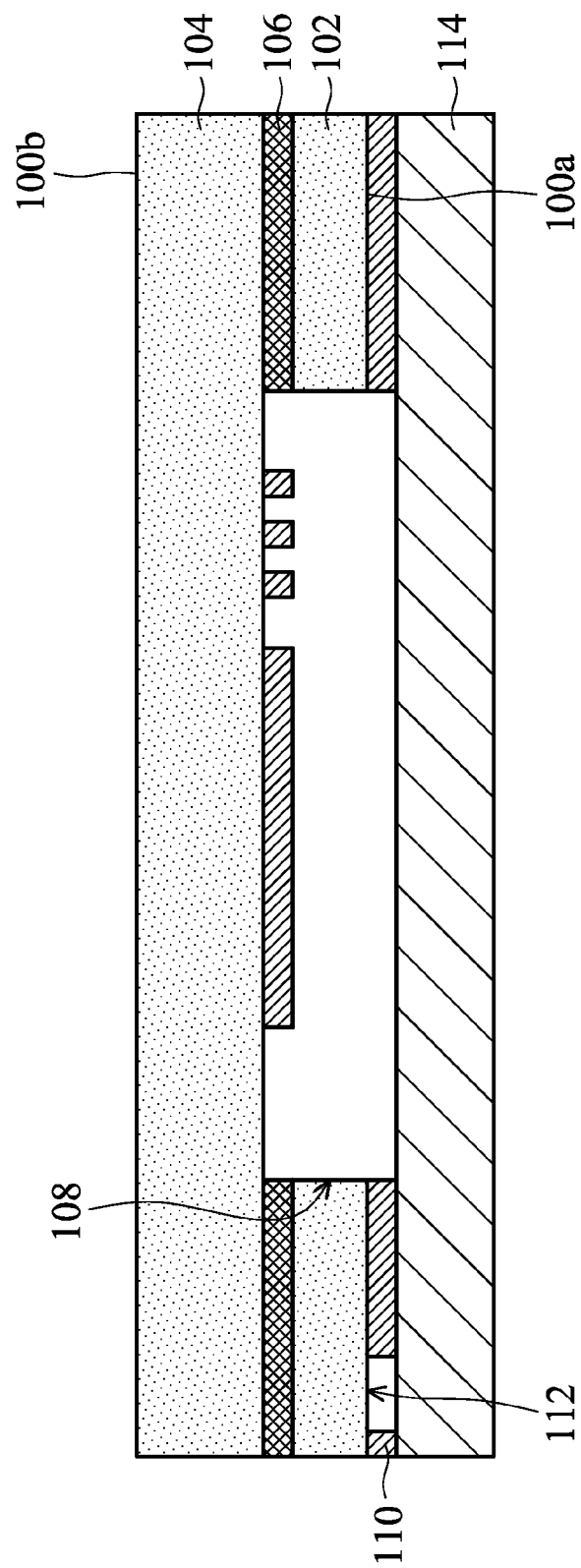

Next, as shown in FIG. 1D, a transparent substrate 114 may be optionally formed on the surface 100a of the substrate 100. The transparent substrate 114 may be, for example, a glass substrate, quartz substrate, transparent polymer substrate, or another suitable transparent substrate. In one embodiment, a glass substrate is used as the transparent substrate 114. As shown in FIG. 1D, the metal layer 110 on the semiconductor layer 102 may be used as an adhesion layer to bond the transparent substrate 114 on the substrate 100. In one embodiment, the transparent substrate 104 is bonded on the substrate 100 through anodic bonding between the transparent substrate 114 and the metal layer 110. A high voltage and temperature may be applied to induce an ion exchange between the transparent substrate 114 and the metal layer 110, such that a bond is formed. However, it should be noted that embodiments of the invention are not limited thereto. In another embodiment, an adhesion layer may be directly applied between the transparent substrate 114 and the substrate 100 to finish the disposing of the transparent substrate 114.

Figure 1E:
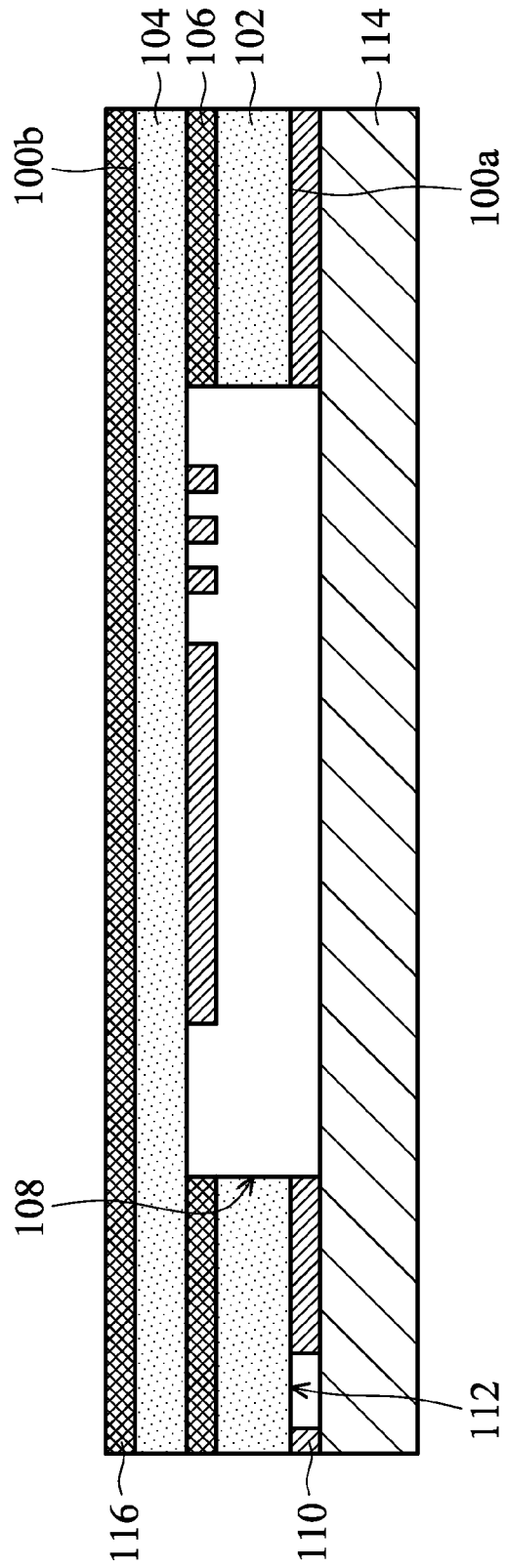

As shown in FIG. 1E, the substrate 100 may be optionally thinned from the surface 100b of the substrate 100. For example, the semiconductor layer 104 may be thinned by a method similar to that used to thin the semiconductor layer 102. In one embodiment, the semiconductor layer 104 is thinned to be (but is not limited to) about 100 μm. Then, a mask layer 116 is formed on the surface 100b of the substrate 100.

Figure 1F:
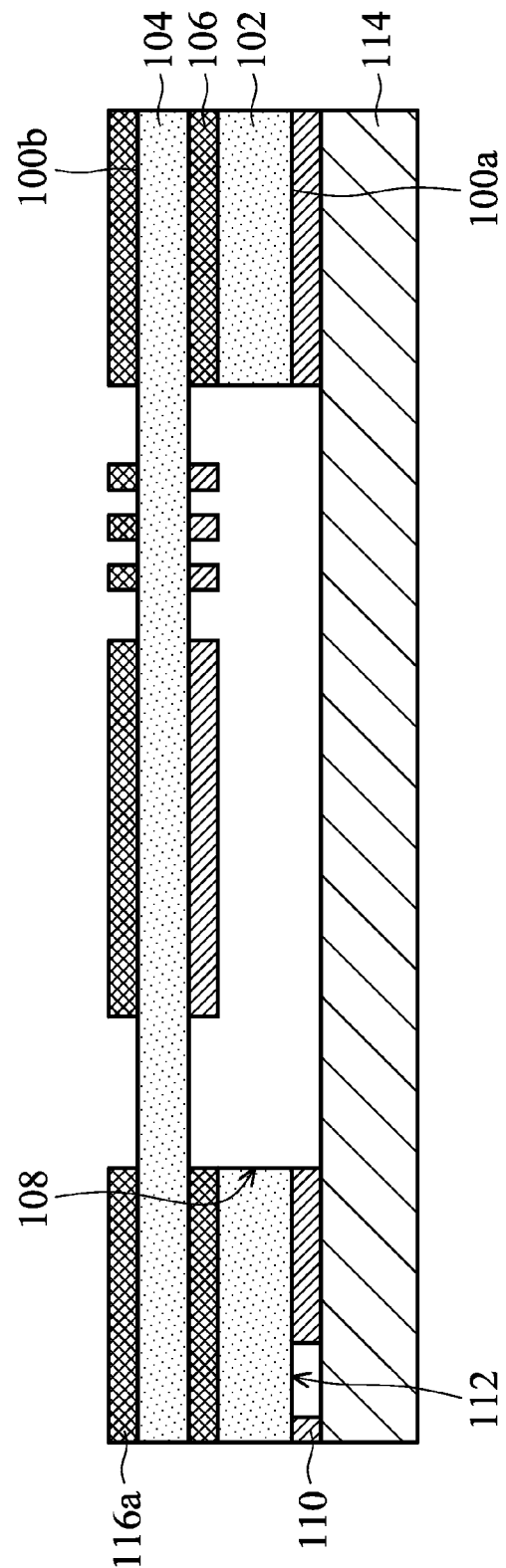

Next, as shown in FIG. 1F, the mask layer 116 is patterned to be a patterned mask layer 116a. In on embodiment, with the assistance of the alignment mark 112 formed in the adhesion layer (i.e., the metal layer 110), the patterned mask layer 116a is formed. As shown in FIG. 1F, the pattern of the patterned mask layer 116a substantially corresponds to the pattern of the metal layer 110.

Figure 1G:
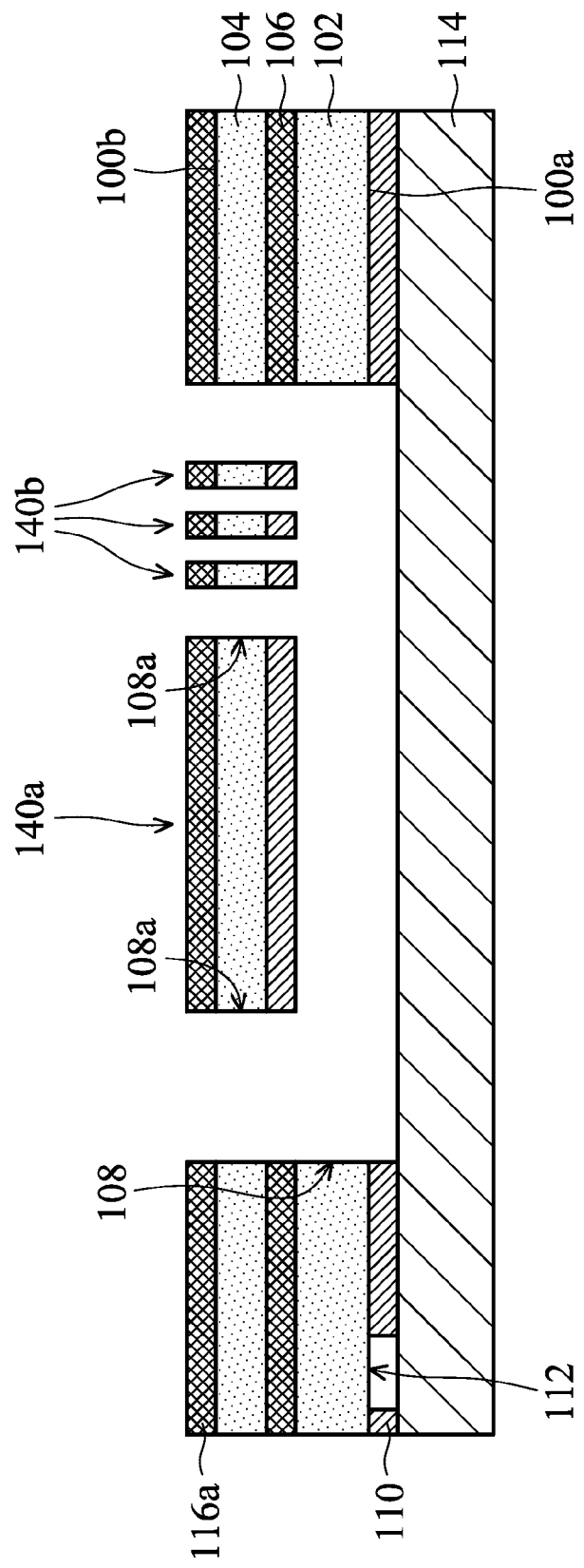

As shown in FIG. 1G, an etching process (such as a dry etching process) may then be performed to the substrate 100 by using the patterned mask layer 116a as a mask to remove the semiconductor layer 104 that is not covered by the patterned mask layer 116a. After the etching process, a plurality of openings 108a are formed in the semiconductor layer 104. The opening 108a extends from the surface 100b towards the surface 100a. In one embodiment, the opening 108a penetrates the substrate 100 and connects with the recess 108. In this case, the openings 108a connect with each other. In another embodiment, the opening 108a extends from the surface 100a towards the surface 100b.

After the openings 108a are formed, at least a first movable bulk 140a and at least a second movable bulk 140b are also simultaneously formed. The first movable bulk 140a and the second movable bulk 140b connect with the substrate 100, respectively. Because connection portions between the first movable bulk 140a and between the second movable bulk 140b and the substrate 100 are small, the first movable bulk 140a and the second movable bulk 140b can move or vibrate relative to the substrate 100 under a suitable condition.

Figure 1H:
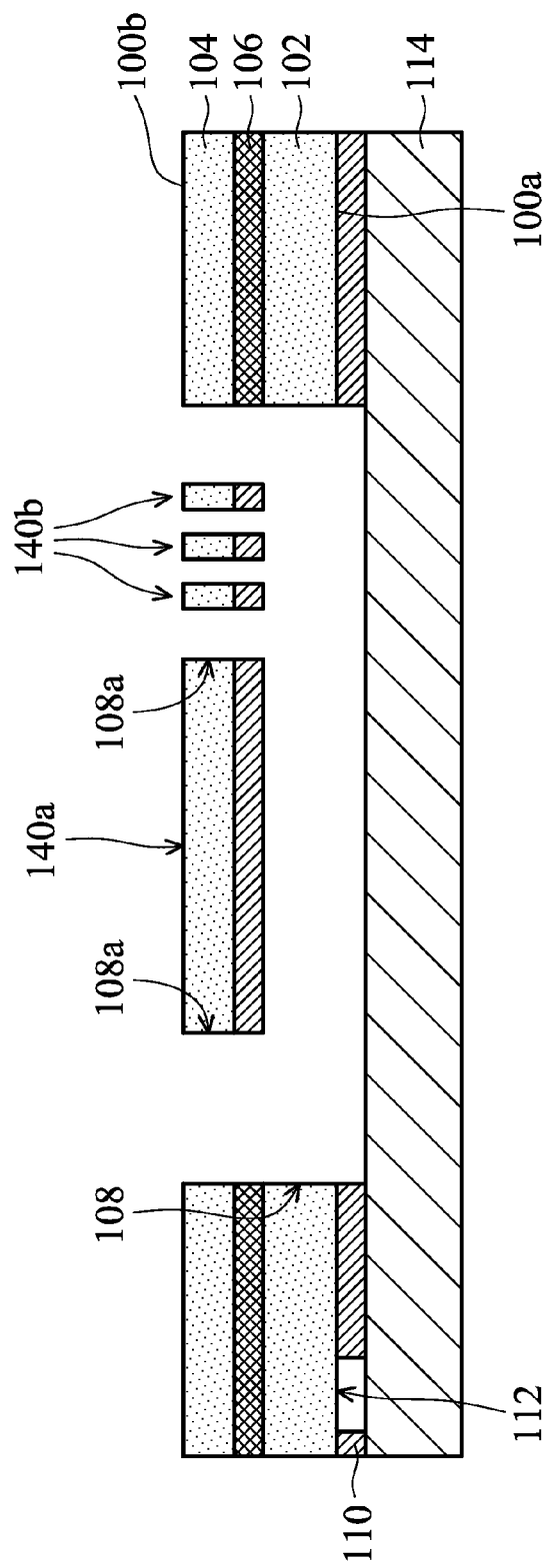

Next, as shown in FIG. 1H, the patterned mask layer 116a is removed from the substrate 100.

Figure 1I:
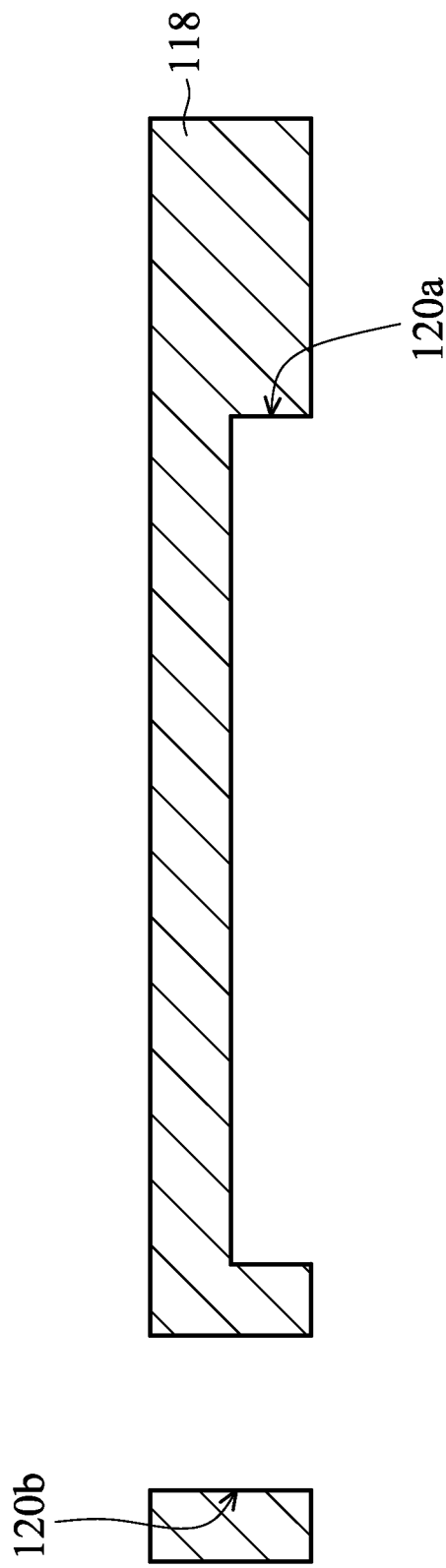

As shown in FIG. 1I, a protecting substrate 118 is then provided. For example, the protecting substrate 118 includes (but is not limited to) a glass substrate or quartz substrate. At least a through-hole 120b is formed in the protecting substrate 118. Note that, in one embodiment, a recess 120a may be optionally formed in the protecting substrate 118. In one embodiment, the substrate 100 is a semiconductor wafer and the size of the protecting substrate 118 may be substantially the same as that of the semiconductor wafer, which facilitates the wafer-level packaging process.

Figure 1J:
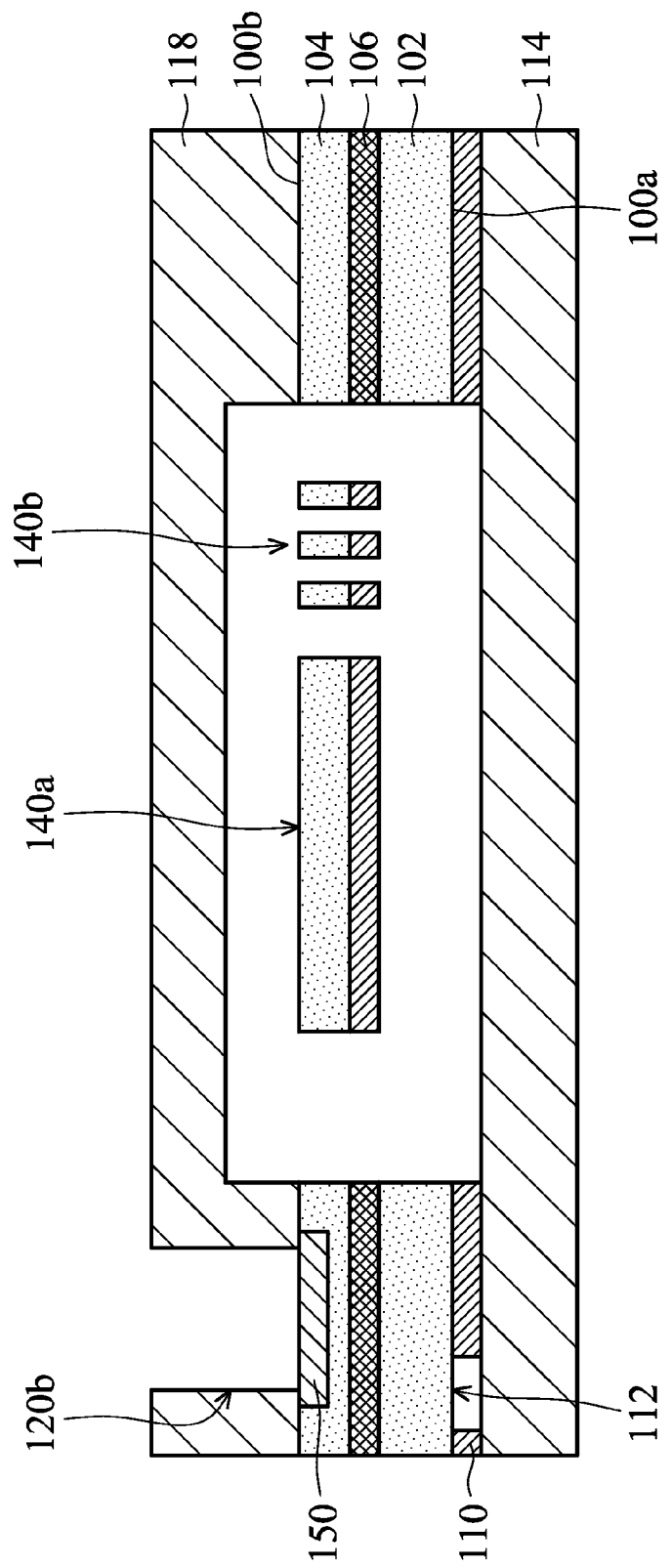

Next, as shown in FIG. 1J, the protecting substrate 118 is disposed on the surface 100b of the substrate 100. Similarly, in one embodiment, the protecting substrate 118 may be bonded on the substrate 100 through anodic bonding between the protecting substrate 118 and the substrate 100 (semiconductor layer 104). Alternatively, in another embodiment, an adhesion layer may be applied on a bottom of the protecting substrate 118 so that the protecting layer 118 is adhered on the substrate 100. As shown in FIG. 1J, the recess previously formed in the protecting substrate 118 may connect with the opening (108a) and the recess (108) in the substrate 100 to provide a sufficient space around the first movable bulk 140a and the second movable bulk 140b such that the first movable bulk 140a and the second movable bulk 140b can move or vibrate in the closed space. Note that the substrate 100 may be exposed by the through-hole 120b previously formed in the protecting substrate 118. In one embodiment, the portion exposed by the through-hole 120b may include a pad 150 which may be electrically connected to the metal layer 100 on one of the second movable bulks 140b. In one embodiment, the metal layer 110 on the second movable bulk 140b may serve as a conducting electrode for driving the second movable bulk 140b. The metal layer 110 on the first movable bulk 140a may serve as a reflective layer. In this case, both the reflective layer and the conducting electrode (or conducting layer) are portions of the metal layer 110 and have the same material.

Figure 1K:
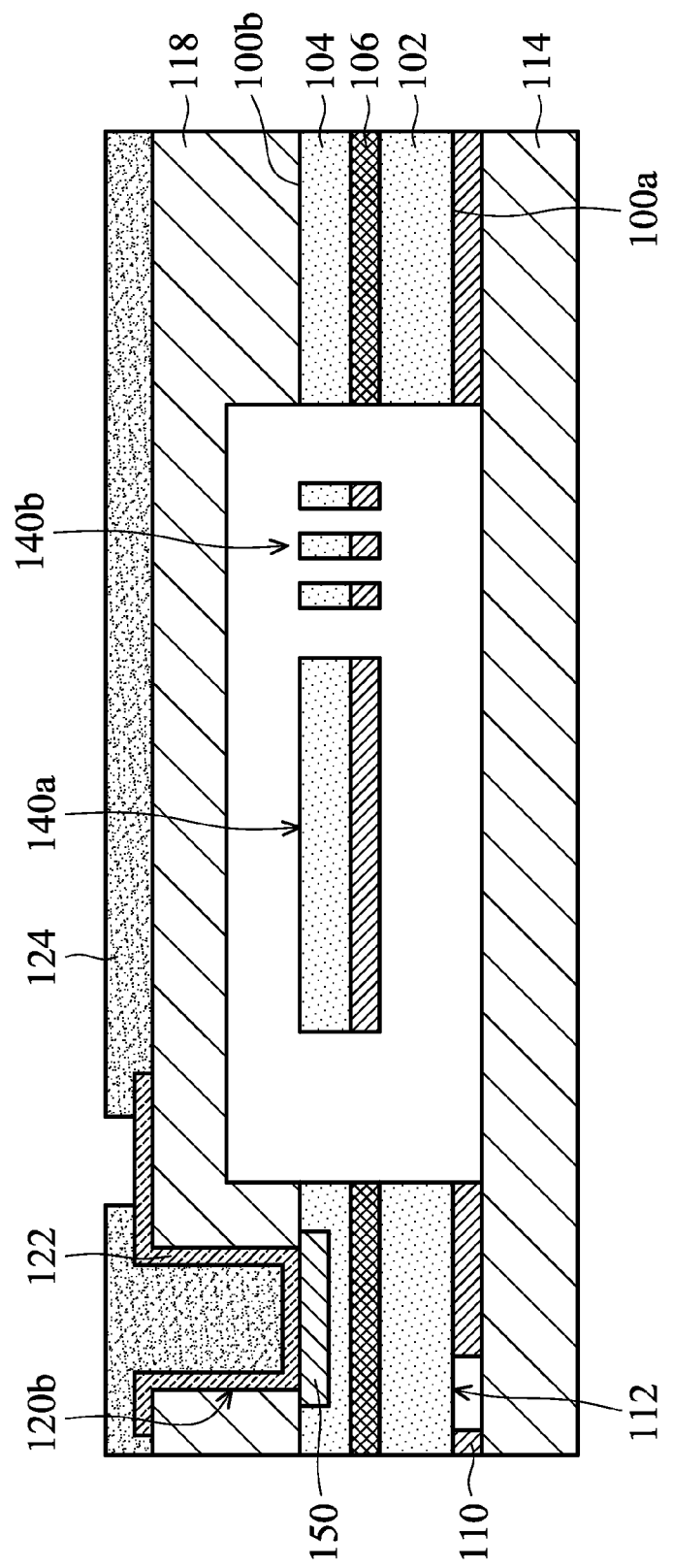

As shown in FIG. 1K, a patterned conducting layer 122 is then formed on the protecting substrate 118, which extends from the surface of the protecting substrate 118 into the through-hole 120b and is electrically connected to one of the second movable bulk 140b. For example, the conducting layer 122 may be electrically connected to the second movable bulk 140b through the pad 150 and the metal layer 110 on the second movable bulk 140b. In one embodiment, an electrical signal may be transmitted to the second movable bulk 140b through the conducting layer 122 to drive the second movable bulk 140b and/or the first movable bulk 140a to move, rotate, and/or vibrate. Note that because the protecting substrate 118 is usually an insulating substrate (such as a glass substrate), it is not necessary to form an insulating layer between the conducting layer 122 and the protecting substrate 118. In this case, the conducting layer 122 directly contacts with the protecting substrate 118. However, in another embodiment, another suitable material layer may be formed between the conducting layer 122 and the protecting substrate 118 depending on the situation.

In one embodiment, an area of the first movable bulk 140a is larger than an area of the second movable bulk 140b, and the metal layer 110 formed on the first movable bulk 140 may serve as a reflective layer. In this case, when an electrical signal is transmitted to the second movable bulk 140b through the conducting layer 122 to drive the second movable bulk 140b and/or the first movable bulk 140a to move, rotate, and/or vibrate, the first movable bulk 140a and the reflective layer (i.e., the metal layer 110 thereon) thereon may serve as a mirror capable of moving, rotating, and/or vibrating. Thus, the incident light may be reflected by the mirror in a wider area. In one embodiment, the mirror may serve as a scanning mirror or a reflective mirror to significantly increase the scanning range or the reflective range. Thus, the scanned information that is obtained or the reflected range of light is increased. For example, the mirror may be applied to (but is not limited to) a scanning mirror element in a laser printer, an optical touch screen, or a pico-projector.

Figure 1L:
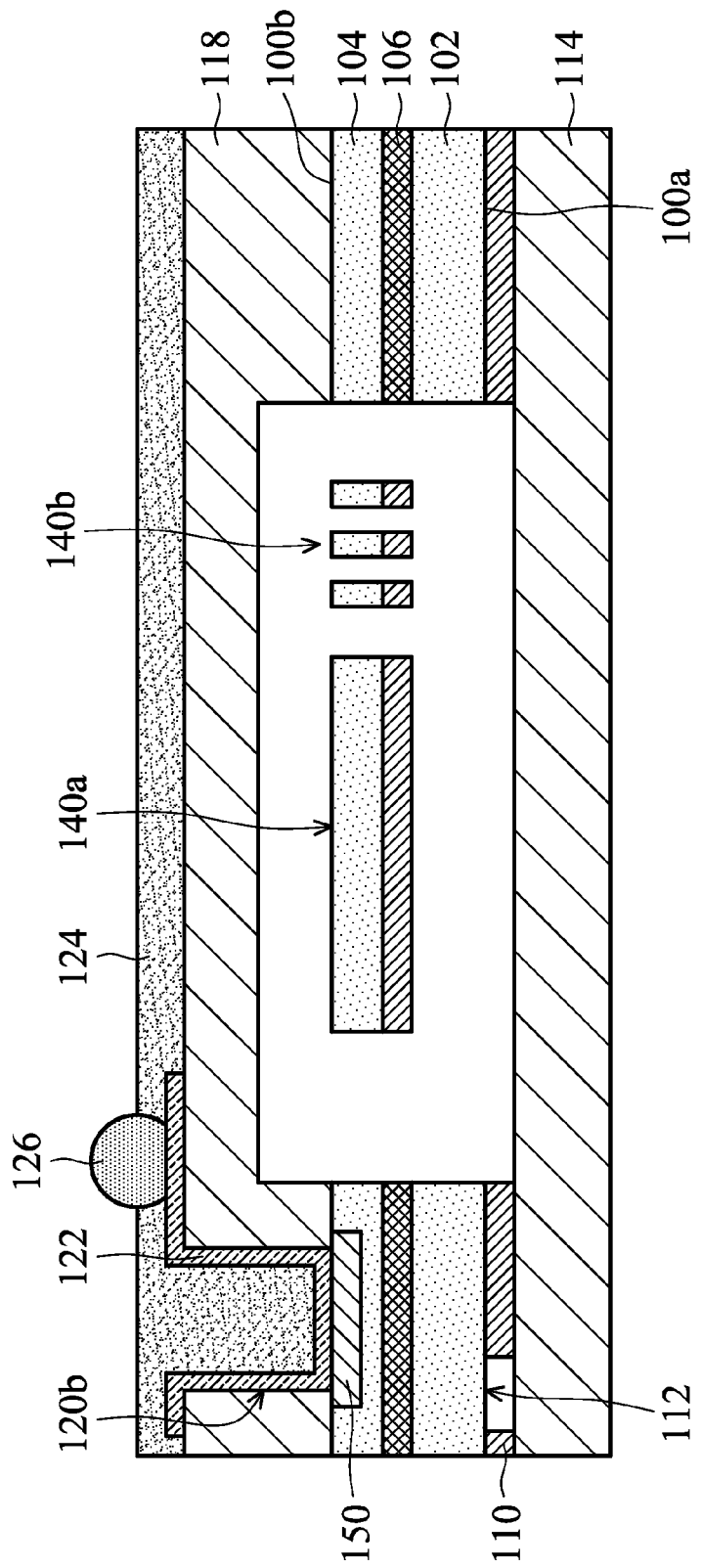

Next, referring to FIGS. 1K and 1L, in one embodiment, a passivation layer 124 may be optionally formed on the protecting substrate 118 and the conducting layer 122, which has an opening exposing a portion of the conducting layer 122. Then, a conducting structure 126 may be disposed on the conducting layer 122 exposed by the opening of the passivation layer 124 for electrically connecting with another element. The conducting structure 126 may be, for example, (but is not limited to) a solder ball or a conducting bump.

If a wafer-level packaging process is applied to form the chip package, a dicing process may be subsequently performed to separate a plurality of chip packages from the scribe lines.

Embodiments of the invention may have a variety of other variations, and the fabrication method or the formation sequence is not limited to the way illustrated in the embodiment of FIG. 1. For example, although the metal layer 110 of the embodiment shown in FIG. 1 may serve as an adhesion layer, a conducting layer, and a reflective layer after being patterned, embodiments of the invention are not limited thereto. In another embodiment, the adhesion layer, the conducting layer, and the reflective layer mentioned above may not be patterned from a same metal layer. The adhesion layer, the conducting layer, and the reflective layer mentioned above may be formed in different process steps and adopt same or different material layers, depending on requirements and/or the convenience of processes.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a chip package, comprising:
providing a substrate having a first surface and a second surface;
removing a portion of the substrate to form a plurality of openings in the substrate, wherein the plurality of openings extend from the first surface towards the second surface or extend from the second surface towards the first surface;
after the plurality of openings are formed, at least a first portion of the substrate serves as a first movable bulk, and at least a second portion of the substrate serves as a second movable bulk, wherein the first movable bulk and the second movable bulk are respectively located between the plurality of openings;
disposing a protecting substrate on the second surface of the substrate;
forming at least a through-hole in the protecting substrate; and
forming at least a conducting layer on the protecting substrate, wherein the conducting layer extends from a surface of the protecting substrate into the through-hole and is electrically connected to the second movable bulk.

2. The method for forming a chip package as claimed in claim 1, wherein the substrate comprises a semiconductor substrate or a semiconductor on insulator substrate.

3. The method for forming a chip package as claimed in claim 1, wherein before the plurality of openings is formed, the method further comprises thinning the substrate from the first surface of the substrate.

4. The method for forming a chip package as claimed in claim 1, further comprising removing a portion of the substrate from the first surface of the substrate to form a recess, wherein the recess extends from the first surface towards the second surface.

5. The method for forming a chip package as claimed in claim 4, wherein before the plurality of openings is formed, the method further comprises:
forming a patterned metal layer on the first surface of the substrate and a bottom of the recess;
forming a patterned mask layer on the second surface of the substrate, wherein locations of portions of the mask layer correspond to locations of portions of the patterned metal layer;
by using the patterned mask layer as a mask, etching and removing a portion of the substrate to form the plurality of openings, the first movable bulk, and the second movable bulk, wherein the plurality of openings and the recess connect with each other; and after the plurality of openings are formed, removing the patterned mask layer.

6. The method for forming a chip package as claimed in claim 5, wherein the formation step of the patterned metal layer comprises:

forming a metal layer on the first surface of the substrate and the bottom of the recess; and patterning the metal layer into the patterned metal layer, wherein a portion of the patterned metal layer is formed on the second movable bulk and forms a conducting connection between the second movable bulk and the conducting layer, and an another portion of the patterned metal layer is formed on the first movable bulk and serves as a reflective layer.

7. The method for forming a chip package as claimed in claim 6, further comprising forming at least an alignment mark in the metal layer when the metal layer is patterned.

8. The method for forming a chip package as claimed in claim 7, wherein the formation step of the patterned mask layer comprises:

forming a mask layer on the second surface of the substrate; and patterning the mask layer into the patterned mask layer based on the alignment mark such that locations of portions of the patterned mask layer correspond to locations of portions of the patterned metal layer on the bottom of the recess.

9. The method for forming a chip package as claimed in claim 5, further comprising disposing a transparent substrate on the first surface of the substrate, wherein the transparent substrate is bonded with a portion of the patterned metal layer on the first surface of the substrate.

10. The method for forming a chip package as claimed in claim 9, wherein the transparent substrate and the patterned metal layer are bonded with each other by an anodic bonding process.

11. The method for forming a chip package as claimed in claim 1, further comprising disposing a transparent substrate on the first surface of the substrate.

12. The method for forming a chip package as claimed in claim 1, further comprising forming a reflective layer on the first movable bulk.

13. The method for forming a chip package as claimed in claim 1, wherein the conducting layer directly contacts with the protecting substrate.

14. The method for forming a chip package as claimed in claim 1, wherein the conducting layer is electrically connected to the second movable bulk through a pad in the substrate directly under the through-hole.

15. The method for forming a chip package as claimed in claim 1, further comprising forming a passivation layer on the protecting substrate and the conducting layer.

16. The method for forming a chip package as claimed in claim 15, further comprising:

patterning the passivation layer such that a portion of the conducting layer is exposed; and forming a conducting structure on the exposed conducting layer, wherein the conducting structure electrically contacts with the conducting layer.

17. The method for forming a chip package as claimed in claim 1, wherein the protecting substrate is disposed on the second surface of the substrate by an anodic bonding process.

18. The method for forming a chip package as claimed in claim 1, further comprising forming a recess from a side of the protecting substrate near the first movable bulk and the second movable bulk.

* * * * *